United States Patent [19]

Suzuki

[11] 4,385,244
[45] May 24, 1983

[54] EXTRANEOUS SIGNAL SEPARATING DEVICE

[75] Inventor: Koichi Suzuki, Tokorozawa, Japan

[73] Assignee: Universal Pioneer Corporation, Tokyo, Japan

[21] Appl. No.: 196,141

[22] Filed: Oct. 10, 1980

[30] Foreign Application Priority Data

Oct. 15, 1979 [JP] Japan .......................... 54-142490[U]

[51] Int. Cl.³ .......................... H03K 5/08; H03K 17/16
[52] U.S. Cl. ...................................... 307/520; 307/543; 307/549; 455/223; 328/165; 328/223
[58] Field of Search ............... 328/162, 163, 165, 223, 328/113, 111, 138, 139; 375/104; 455/223, 224, 269, 547, 548; 307/520, 543, 549, 269

[56] References Cited

U.S. PATENT DOCUMENTS

| | | | |
|---|---|---|---|
| 3,246,080 | 4/1966 | Ritchey | 307/269 |
| 3,549,901 | 12/1970 | Ross et al. | 307/520 |
| 3,609,408 | 9/1971 | Motisher | 328/113 |
| 3,619,648 | 11/1971 | Wolber | 307/543 |
| 3,646,269 | 2/1972 | Fudemoto et al. | 307/269 |
| 3,689,845 | 9/1972 | Hepp | 375/104 |
| 3,716,726 | 2/1973 | Trimble | 307/549 |
| 4,114,105 | 9/1978 | Duncan | 455/223 |

Primary Examiner—John S. Heyman
Attorney, Agent, or Firm—Michael J. Striker

[57] ABSTRACT

A device for removing extraneous signal components from signals containing a series of pulse components appearing on a signal transmission line at regular intervals and having a predetermined repetition frequency, wherein the signal transmission line is periodically connected to a predetermined potential for periods of time when the signals on the transmission line contain extraneous signal components so that only the regular pulse components contained in the original signals are delivered from the transmission line.

9 Claims, 5 Drawing Figures

EXTRANEOUS SIGNAL SEPARATING DEVICE

FIELD OF THE INVENTION

The present invention relates to a device for removing extraneous signal components for a succession of signals appearing on a signal transmission line. While a device of this nature may find practical application in various kinds of electric circuits and applicances using signal currents, such a device will prove useful in, for example, for removing noises and equalizing pulses from horizontal synchronizing signals extracted from video signals and thereby driving synchronizing pulses alone from the synchronizing signals in a television, video tape recorder or a video disc player.

BACKGROUND OF THE INVENTION

In a video recording and reproducing system such as a video tape recorder or a video disc player, the vertical and horizontal synchronizing signals contained in the video signals to be reproduced are utilized for controlling various servo control circuits included in the recording and reproducing system. The horizontal synchronizing signals in particular are useful for controlling the rotational motion of the video head in a video tape recorder. In a video disc player, the horizontal synchronizing signals are used for the control of the servo system for controlling the rotational speed of the disc-carrying spindle and the tangential servo system for controlling the relative movement between the information pickup device and the disc on the spindle in a tangential direction of the disc. Such horizontal synchronizing signals are extracted from the video signals read out from the video tape or the video disc being played back.

The output signals delivered from the horizontal synchronizing signal separation circuit of a video tape recorder or a video player contain noises and equalizing pulses in addition to horizontal synchronizing pulse components. It is therefore of importance to remove these extraneous signal components from the original horizontal synchronizing signals and thereby obtaining the horizontal synchronizing pulses alone before the synchronizing signals are to be fed to the servo control circuits.

An object of the present invention is to provide a device which can be used for this purpose.

SUMMARY OF THE INVENTION

In accordance with the present invention, such an object is achieved in a device for removing extraneous signal components from a succession of signals appearing on a signal transmission line and containing therein a series of regular pulse components having a predetermined repetition frequency, comprising wave generating means operative to produce a wave having a frequency which is equal to the repetition frequency of the regular pulse components, and switch means connected between said signal transmission line and ground or a predetermined potential and operative to close when the magnitude of the wave produced by the wave generating means is in predetermined relationship to a predetermined value. The predetermined relationship may be such that the magnitude of the wave is higher than the predetermined value.

BRIEF DESCRIPTION OF THE DRAWING

The features and advantages of the device according to the present invention will be appreciated more clearly from the following description taken in conjunction with the accompanying drawing, in which.

DESCRIPTION OF THE PREFERRED EMBODIMENT

Figure 1:
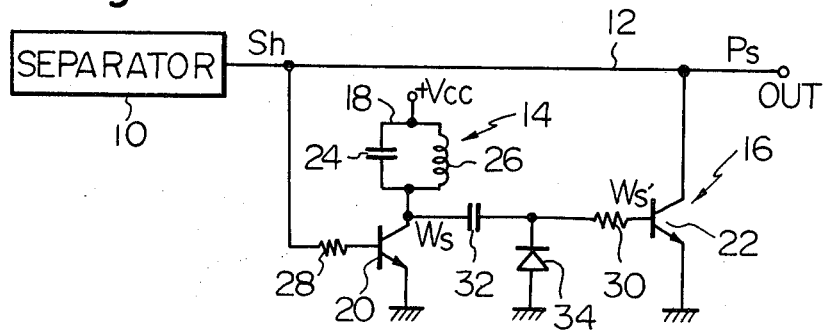
FIG. 1 is a schematic view showing the circuit arrangement of a preferred embodiment of the device according to the present invention.
Figure 2A:
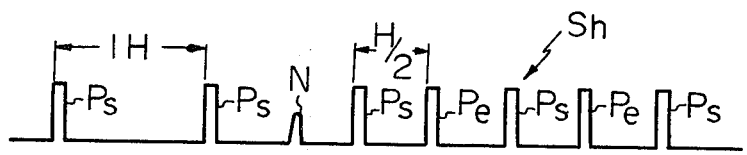
FIGS. 2A to 2D are graphs showing waveforms appearing in the circuit arrangement illustrated in FIG. 1.

Referring to FIG. 1 of the drawing, a horizontal synchronizing signal separation circuit diagrammatically shown at 10 forms part of a reproduction system of a television, a video tape recorder or a video disc player and is thus usually constituted by a differentiator circuit as is well known in the art. During operation of such a reproduction system, a succession of line or horizontal synchronizing signals Sh which are composed of synchronizing pulses Ps, equalizing pulses Pe and noises N as shown in FIG. 2A. The synchronizing pulses Ps are herein assumed, by way of example, to have a pulse repetition frequency of 15.75 KHz and are thus delivered from the separation circuit 10 at regular time intervals of approximately 63.5 microseconds ($=1H$). In this instance, the equalizing pulses Pe also have a pulse repetition frequency of 15.75 KHz and appear at timings equally intervening between some of the synchronizing pulses Ps. The signals Sh thus composed of the synchronizing pulses Ps, a equalizing pulses Pe and noises N are delivered to signal transmission line 12.

The device embodying the present invention is intended to remove the equalizing pulses Pe and noises N as extraneous from the original composite signal Sh and to thereby separate the horizontal synchronizing pulses Ps from the extraneous signal components Pe and N.

To achieve this end, the device shown in FIG. 1 comprises a wave generating network 14 adapted to produce a continuous wave having a frequency equal to the repetition frequency of the horizontal synchronizing pulses Ps and a switch network 16 electrically connected between the signal transmission line 12 and ground or a predetermined potential and adapted to close when the magnitude of such a wave is higher than a predetermined value.

In FIG. 1, the wave generating network 14 of such a device is shown comprising a resonance circuit 18 and a wave forming transistor 20, while the switch network 16 is shown comprising a switching transistor 22. The resonance circuit 18 forming part of the wave generating network 14 is shown by way of example as consisting of a parallel combination of a capacitor 24 and an inductor 26.

The transistor 20 in the wave generating network 14 has a base electrode connected through a resistor 28 to the signal transmission line 12, a collector electrode connected to the output terminal of the resonance circuit 18, and an emitter electrode connected to ground as shown. On the other hand, the transistor 22 constituting the switch network 16 has a base electrode connected through a resistor 30 to the output terminal of the wave generating network 14, viz., the collector electrode of the transistor 20, a collector electrode connected to the signal transmission line 12, and an emitter electrode connected to ground. Between the collector electrode of the wave generating transistor 20 and the base electrode of the switching transistor 22 is preferably connected a direct-current blocking capacitor 32 which is shown connected between the collector electrode of the wave forming transistor 20 and the resistor 30 for the base electrode of the switching transistor 22. Furthermore, a diode may be connected to a junction between the collector electrode of the wave forming transistor 20 and the base electrode of the switching transistor 22 as shown, for the purpose to be described. The diode 34 is shown having its anode terminal connected to ground and its cathode terminal connected between the direct-current blocking capacitor 32 and the resistor 30 for the base electrode of the switching transistor 22.

Figure 2B:
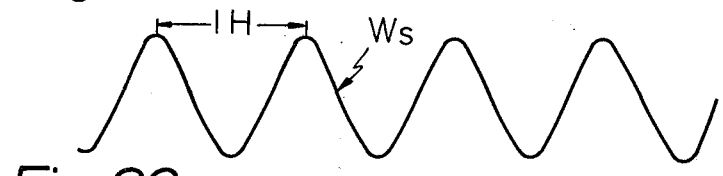

In operation, the horizontal synchronizing signals Sh extracted from original composite video signals by the horizontal synchronizing signal separation circuit 10 are delivered in succession to the signal transmission line 12 and are fed through the resistor 28 to the base electrode of the wave forming transistor 20. The time constant of the resonance circuit 18 is selected so that the wave generating network 14 composed of the resonance circuit 18 and the transistor 20 is capable of producing a sinusoidal wave Ws having the frequency of 15.75 KHz and peaks appearing in synchronism with the synchronizing pulses Ps contained in the signals Sh, as shown in FIG. 2B. The sinusoidal wave Ws thus produced by the wave generating network 14 appears at the collector electrode of the transistor 20 and is passed through the direct-current blocking capacitor 32 and the resistor 30 to the base electrode of the transistor 22 constituting the switch network 16. In the instance, the diode 34 serves to prevent the negative components of the sinusoidal wave Ws from exceeding the peak reverse voltage between the base and emitter electrodes of the switching transistor 22.

Figure 2C:
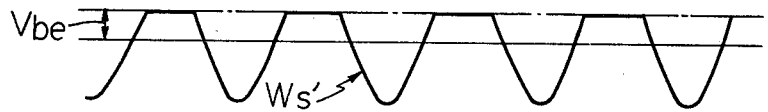

The switching transistor 22 is selected to have a base saturation voltage Vbe of, for example, approximately 0.7 volt so that the switching transistor 22 becomes conductive when the voltage impressed on the base electrode of the transistor 22 becomes higher than 0.7 volt. The voltage appearing at the base electrode of the switching transistor 22 is therefore limited below the level of approximately 0.7 volt and takes a waveform Ws' shown in FIG. 2C. The switch network 16 can accordingly be referred to also as a limiter circuit.

Figure 2D:
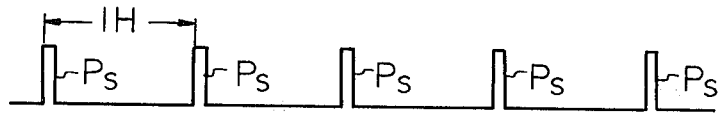

When the switching transistor 22 thus remained conductive, the horizontal synchronizing signals Sh delivered to the signal transmission line 12 are passed to ground through the collector and emitter electrodes of the switching transistor 22 and are therefore prevented from being transmitted to the stage subsequent to the signal transmission line 12. The transistor 22 is held in conduction state and accordingly the signal transmission line 12 is grounded for a period of time intervening between every consecutive two of the horizontal synchronizing pulses Ps as will be seen from FIGS. 2A and 2C. For this reason, only those components of the signals Sh which intervene between the consecutive horizontal synchronizing pulses Ps are passed to ground through the switching transistor 22. On the other hand, in the presence of the horizontal synchronizing pulses Ps in the signals Sh delivered to the signal transmission line 12, the voltage impressed on the base electrode of the switching transistor 22 is lower than the base saturation voltage of the switching transistor 22, which is accordingly held in non-conduction state. Under this condition, the switch network 16 remains closed so that the signals Sh containing the horizotal synchronizing pulses Ps alone are permitted to reach the stage subsequent to the signal transmission line 12. From the signal transmission line 12 is thus delivered a series of horizontal synchronizing signals Ps at time intervals of approximately 63.5 microseconds as shown in FIG. 2D.

It has been assumed in the foregoing description that the signals to be processed in the device according to the present invention contain pulse components having a positive polarity. It will however be apparent that the present invention can be used for the processing of signals containing negative pulse components. In this instance, the wave produced by the wave generating means of such a device has a polarity inverse to the polarity of the sinusoidal wave Ws produced by the wave generating network 14 in the embodiment of FIG. 1 and, for this reason, it is necessary that switching means of the device be constructed and arranged to be open when the magnitude of the wave is lower than a predetermined reference value.

What is claimed is:
1. A device for removing extraneous signal components from a pulse signal carried on a transmission line and containing a series of regular pulses appearing at a predetermined repetition frequency, which comprises:
   (a) resonance circuit means adapted to receive said pulse signal so as to produce a periodic wave signal having a frequency equal to the repetition frequency of said regular pulses; and
   (b) a gate circuit connected to said transmission line and controlled by said resonance circuit means, for prohibiting said pulse signal to pass said transmission line only during predetermined portions of either one half cycle of the repetition period of said periodic wave signal to thus remove said extraneous signal components without affecting the transmitted pulses thereof.

2. A device as defined in claim 1, wherein said gate circuit includes a switch element connected between said transmission line and a predetermined reference potential point and operative to pass therethrough said pulse signal from said transmission line to said predetermined reference potential point only during said either one half cycle.

3. A device as defined in claims 1 or 2, wherein said gate circuit is adapted to prohibit said pulse signal to pass therethrough when said periodic wave signal has a magnitude either larger or smaller than a predetermined level.

4. A device as defined in claim 2, wherein said switch element includes a transistor having the base terminal connected to said resonance circuit thereby to receive said periodic wave signal and the collector terminal connected to said transmission line, the emitter terminal of said transistor being connected to said reference potential point.

5. A device as defined in claim 4, wherein said switch element further includes a diode bypassing the base and emitter terminals of said transistor.

6. A device as defined in claim 1, further comprising a direct-current blocking capacitor connected between said resonance circuit means and said gate circuit.

7. A device as defined in claim 1, wherein said resonance circuit means includes a transistor having the base terminal thereof to be applied said pulse signal and the emitter thereof connected to a reference potential point, and a resonance circuit connected between the collector terminal of said transistor and a voltage source and operative to pass therethrough a wave signal having the same frequency as that of the repetition frequency of said regular pulses, so as to produce said periodic wave signal at the collector terminal of said transistor.

8. A device as defined in claim 7, wherein said resonance circuit includes a parallel connection of an inductor and a capacitor.

9. A device as defined in claim 1, further comprising a separator for separating a horizontal synchronizing pulse signal as said pulse signal from a composite video signal.

* * * * *